(12) United States Patent
Yamada et al.

(10) Patent No.: US 6,418,553 B1
(45) Date of Patent: Jul. 9, 2002

(54) CIRCUIT DESIGNING METHOD FOR SEMICONDUCTOR DEVICE AND COMPUTER-READABLE MEDIUM

(75) Inventors: Akiko Yamada, Tokyo-To; Koji Hashimoto; Shoji Mimotogi, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,951

(22) Filed: Mar. 10, 2000

(30) Foreign Application Priority Data

Mar. 12, 1999 (JP) .......................... 11-067021

(51) Int. Cl.[7] .................... G06F 7/60; G06F 17/10
(52) U.S. Cl. ........................ 716/21; 716/19
(58) Field of Search ................. 716/1, 2, 19, 20, 716/21; 356/237.4, 237.5, 394; 382/144; 430/5, 30

(56) References Cited

U.S. PATENT DOCUMENTS

| | | | | |
|---|---|---|---|---|
| 5,161,114 A | * | 11/1992 | Akiyama ................. | 716/21 |
| 5,521,033 A | * | 5/1996 | Okamoto ................ | 430/311 |
| 6,004,701 A | * | 12/1999 | Uno et al. .............. | 430/5 |
| 6,225,025 B1 | * | 5/2001 | Hoshino ................. | 430/296 |
| 6,243,855 B1 | * | 6/2001 | Kobayashi et al. ...... | 716/19 |
| 6,295,637 B1 | * | 9/2001 | Li ......................... | 430/270.1 |
| 6,298,473 B1 | * | 10/2001 | Ono et al. .............. | 430/30 |
| 6,334,209 B1 | * | 12/2001 | Hashimoto et al. ..... | 378/35 |

FOREIGN PATENT DOCUMENTS

| | | |
|---|---|---|
| JP | 10-004048 | 1/1998 |
| JP | 10-232484 | 9/1998 |

OTHER PUBLICATIONS

H.–E. Kim, et al., Pros. SPIE, vol. 3334, pp. 532–542, "Optimization of Stepper Parameters and Its Design Rule for Attenuated Phase–Shifting Mask", 1998.

* cited by examiner

Primary Examiner—Matthew Smith
Assistant Examiner—Paul Dinh
(74) Attorney, Agent, or Firm—Oblon, Spivak, McClelland, Maier & Neustadt, P.C.

(57) ABSTRACT

There are provided a circuit designing method using a half-tone phase shift mask for forming a circuit pattern on a semiconductor substrate, and a computer-readable medium having recorded a program for causing a computer to execute the circuit designing method. The circuit designing method comprises the steps of: calculating a first lithography process tolerance, which is an index satisfying a range of a dimensional fluctuation allowed when a basic pattern representative of the circuit pattern is formed on the semiconductor substrate, and calculating a second lithography process tolerance, which is an index capable of avoiding the formation of a side lobe capable of being produced on the semiconductor substrate when the basic pattern is formed on the semiconductor substrate using the half-tone phase shift mask, respectively, using an optical simulation; calculating a common lithography process tolerance comprising an overlapping region of the first lithography process tolerance and the second lithography process tolerance; preparing an inhibiting rule for excluding a circuit pattern including the basic pattern, which is below a reference value previously set on the basis of the common lithography process tolerance, from an object to be designed; and designing a circuit using the inhibiting rule.

16 Claims, 9 Drawing Sheets

CIRCUIT DESIGNING METHOD FOR SEMICONDUCTOR DEVICE AND COMPUTER-READABLE MEDIUM

BACKGROUND OF THE INVENTION

1. Field of the Invention

The present invention relates generally to a circuit designing method for a semiconductor device, and a computer-readable medium. More specifically, the invention relates to a circuit designing method for a semiconductor device, which uses a half-tone phase shift mask for forming a circuit pattern on a semiconductor substrate, and a computer-readable medium having recorded a program for causing a computer to execute the circuit designing method.

2. Description of the Prior Art

In recent years, the scale down of a semiconductor device has been accelerated. For that reason, the development of a material, system and method for easily processing a fine pattern on a semiconductor substrate does not follow the speed of the scale down, so that it is difficult to ensure a process tolerance required for the production of the device. In the field of lithography, various super resolution exposure methods have been proposed as techniques for improving the process tolerance using a conventional system. For example, a half-tone phase shift mask is widely used since it is relatively easy to prepare a mask. However, if the half-tone phase shift mask is used, there are some cases where a secondary light peak called a side lobe is produced at a place other than a desired pattern. When the side lobe is transferred to a positive or negative resist, the resist has a defect so that the thickness of the positive resist decreases or the negative resist remains. As a result, there is a problem in that the effective process tolerance decreases. In order to avoid this problem, the light intensity of the side lobe has only to decrease. For example, there have been used a method for increasing a coherence factor σ which is one of illumination conditions of an aligner, a method for providing a master pattern with a bias quantity to increase the size of an opening, a method for decreasing a half-tone phase transmittance, and so forth.

However, these techniques decrease the process tolerance of a desired pattern itself although the techniques avoid the transfer of the side lobe. Therefore, it is required to optimize the conditions for avoiding the transfer of the side lobe and for ensuring the process tolerance of a desired pattern. However, since the light intensity of the side lobe greatly depends on a pattern layout, there is also a problem in that even if the optimized conditions for preventing the influence of the side lobe in a certain pattern layout are used, the influence of the side lobe is strong in another pattern layout. Thus, it is strongly desired to reduce the influence of the side lobe in all of pattern layouts and to ensure a required and sufficient process tolerance. On the other hand, it is required to provide an optical simulator capable of taking account of the process tolerance including the influence of the side lobe, as a tool for efficiently optimizing illumination conditions and a master bias. In a conventional optical simulator, as one of techniques for taking account of the influence of the side lobe, there is a method for slicing an image by the light intensity, by which a desired pattern having a desired dimension is finished in the best focus, to monitor an image contour line produced in a place other than the desired pattern. However, this technique is not applicable since it is qualitative and can not take account of the difference at the level of the transfer of the side lobe which varies in accordance with the resist process. Similarly, there is a method for deriving a ratio of an edge light intensity when a desired pattern having a desired dimension is finished in the best focus, to a side lobe light intensity as a threshold. In this technique, when the threshold is 1 in the case of only an optical image, the influence of the resist process is expressed by a decimal as a proportion thereof, so that it is possible to quantitatively evaluate the difference in resist process. However, when the light exposure varies or when defocusing occurs, the threshold has a different value, so that this technique is not applicable in the evaluation of the process tolerance, which must take account of both of the influence of the light exposure and the influence of the defocusing. Moreover, a technique for varying the pattern layout to calculate the side lobe light intensity to extract a pattern layout rule which is easily influenced by the side lobe is proposed in, e.g., "H. Kim et al., Pros. SPIE, Vol. 3334, Optical Microlithography, p532 (1988)". However, in this proposal, it is not clear how much the side lobe light intensity is decreased to obtain a sufficient process tolerance.

SUMMARY OF THE INVENTION

It is therefore an object of the present invention to eliminate the aforementioned problems and to provide a circuit designing method for a semiconductor device, which can remove the influence of a produced side lobe pattern and ensure a required and sufficient process tolerance when a half-tone phase shift mask is used, and a computer-readable medium having recorded a program for causing a computer to execute the circuit designing method.

In order to accomplish the aforementioned and other objects, the inventors prepared a design rule using only a region capable of obtaining a required and sufficient process tolerance by calculating a side lobe transfer characteristic value for a resist process and by quantifying a process tolerance in each of pattern layouts using the transfer characteristic value.

According to the first aspect of the present invention, there is provided;
a circuit designing method for a semiconductor device, which uses a half-tone phase shift mask for forming a circuit pattern on a semiconductor substrate, the method comprising: a first step of extracting a basic pattern representative of the circuit pattern from design information; a second step of setting parameters serving as conditions for a circuit design; a third step of calculating a first lithography process tolerance, which is an index satisfying a range of a dimensional fluctuation allowed when the basic pattern is formed on the semiconductor substrate, using an optical simulation; a fourth step of a second lithography process tolerance, which is an index capable of avoiding the formation of a side lobe capable of being produced on the semiconductor substrate when the basic pattern is formed on the semiconductor substrate using the half-tone phase shift mask, using an optical simulation; a fifth step of calculating a common lithography process tolerance comprising an overlapping region of the first lithography process tolerance and the second lithography process tolerance; a sixth step of preparing an inhibiting rule for excluding a circuit pattern including the basic pattern, which is below a reference value previously set on the basis of the common lithography process tolerance, from an object to be designed; and, a seventh step of designing a circuit using the inhibiting rule.

According to the second aspect of the present invention, there is provided;
a computer-readable medium for use in a circuit designing system for designing a semiconductor device using a half-tone phase shift mask for forming a circuit pattern on a semiconductor substrate, the medium having recorded a program for causing a computer to execute a circuit designing method for the semiconductor device, the method including: a first procedure for extracting a basic pattern representative of the circuit pattern from design information; a second procedure for setting parameters serving as conditions for a circuit design; a third procedure for calculating a first lithography process tolerance, which is an index satisfying a range of a dimensional fluctuation allowed when the basic pattern is formed on the semiconductor substrate, using an optical simulation; a fourth procedure for a second lithography process tolerance, which is an index capable of avoiding the formation of a side lobe capable of being produced on the semiconductor substrate when the basic pattern is formed on the semiconductor substrate using the half-tone phase shift mask, using an optical simulation; a fifth procedure for calculating a common lithography process tolerance comprising an overlapping region of the first lithography process tolerance and the second lithography process tolerance; a sixth procedure for preparing an inhibiting rule for excluding a circuit pattern including the basic pattern, which is below a reference value previously set on the basis of the common lithography process tolerance, from an object to be designed; and, a seventh procedure for designing a circuit using the inhibiting rule.

According to the invention, a common lithography process tolerance comprising an overlapping ration of first and second lithography process tolerance, each of which is calculated using an optical simulation, is calculated, a sufficient lithography process tolerance can be given to a circuit design for a semiconductor device using a half-tone phase shift mask, without transferring a side lobe to a semiconductor substrate.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below. Furthermore, in the following drawings, the same reference numbers are used for the same portions, and the descriptions thereof are omitted.

(1) First Preferred Embodiment

Figure 1:
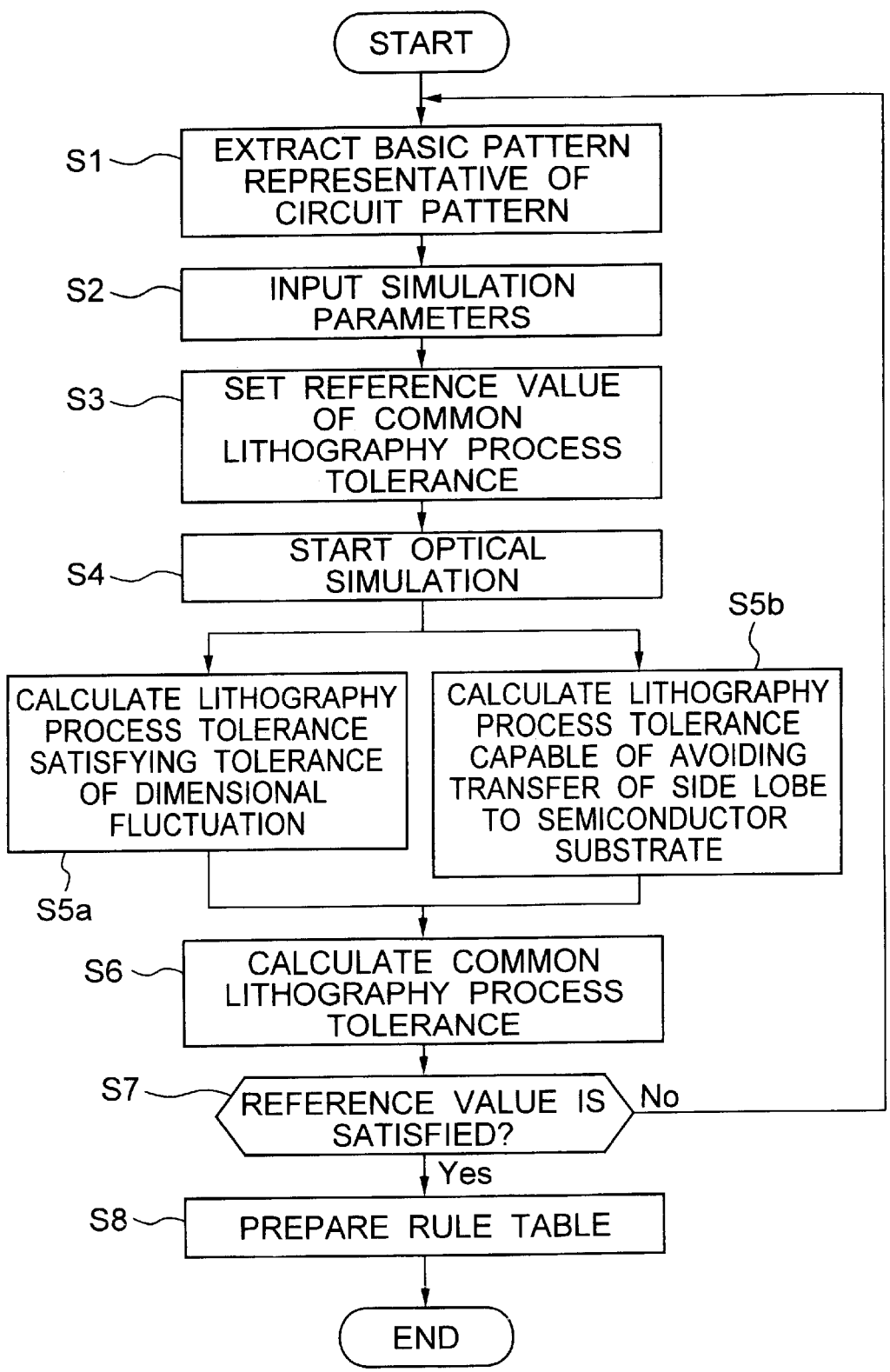
FIG. 1 is a flow chart for explaining the first preferred embodiment of a method for designing a semiconductor circuit device according to the present invention.

FIG. 1 is a flow chart for explaining the first preferred embodiment of a method for designing a semiconductor circuit device according to the present invention.

Figure 2:
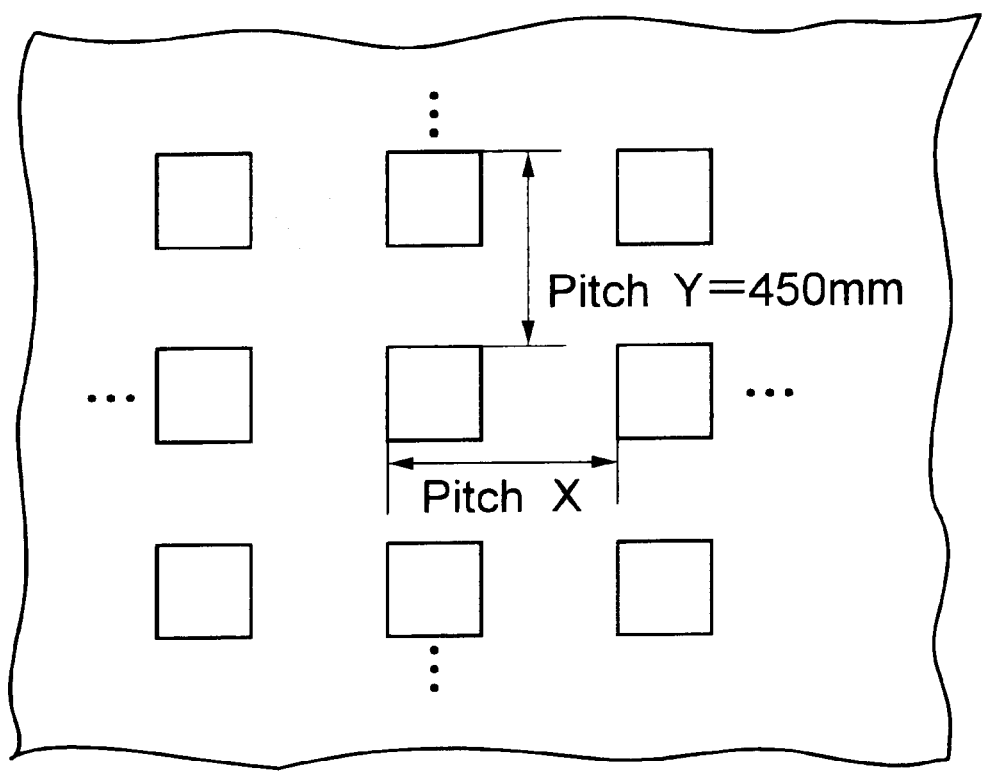
FIG. 2 is a schematic diagram of an example of a basic pattern extracted by the designing method shown in FIG. 1.

First, as shown in this figure, some basic patterns representative of a circuit pattern intended to be realized on a semiconductor substrate are extracted on the basis of design information (step S1). An example of a basic pattern extracted in this preferred embodiment is shown in FIG. 2. The basic pattern shown in this figure is a pattern group comprising some basic patterns wherein contact holes formed by a design rule of 0.2 μm are arranged in the form of a lattice and wherein the pattern pitch in Y directions is commonly fixed to 450 nm whereas the pattern pitch in X directions varies in the range of from 400 nm to 1.200 nm.

Then, simulation parameters are inputted by the input means of a simulator (step S2). These simulation parameters include at least exposure conditions of an aligner and resist process conditions, and reproduce an actual lithography process in the simulator. The exposure conditions may include an exposure wavelength, a lens numerical aperture NA, a coherence factor σ, a half-tone transmittance T and so forth. In addition, the resist process conditions may include the thickness of a resist and an underlayer, optical conditions for the resist and the underlayer, a coefficient indicative of a transfer degree of a side lobe, and so forth.

Then, a reference value of a lithography process tolerance for calculating an inhibiting region indicative of a pattern pitch range to be removed from an object to be designed is set (step S3).

This reference value may include, e.g., a focal depth of 0.5 μm and a light exposure tolerance of 10%, which will be described later, and is set in accordance with a required specification of a semiconductor circuit serving as an object to be designed.

Then, with respect to each of the basic patterns of the basic pattern group extracted at step S1, an optical simulation is started using the simulation parameters given at step S2 (step S4). Then, with respect to each of the basic patterns, the results of the optical simulation are used to calculate a first lithography process tolerance satisfying a tolerance of dimensional fluctuation, which is a dimensional change allowed to satisfy the required specification of the semiconductor device (step S5a). Referring to the characteristic diagram of FIG. 3, an example of the calculated lithography process tolerance will be described. In this figure, a substantially arched region surrounded by two solid lines shows the first lithography process tolerance calculated for a certain basic pattern of the basic pattern group executed at step S1.

Figure 3:
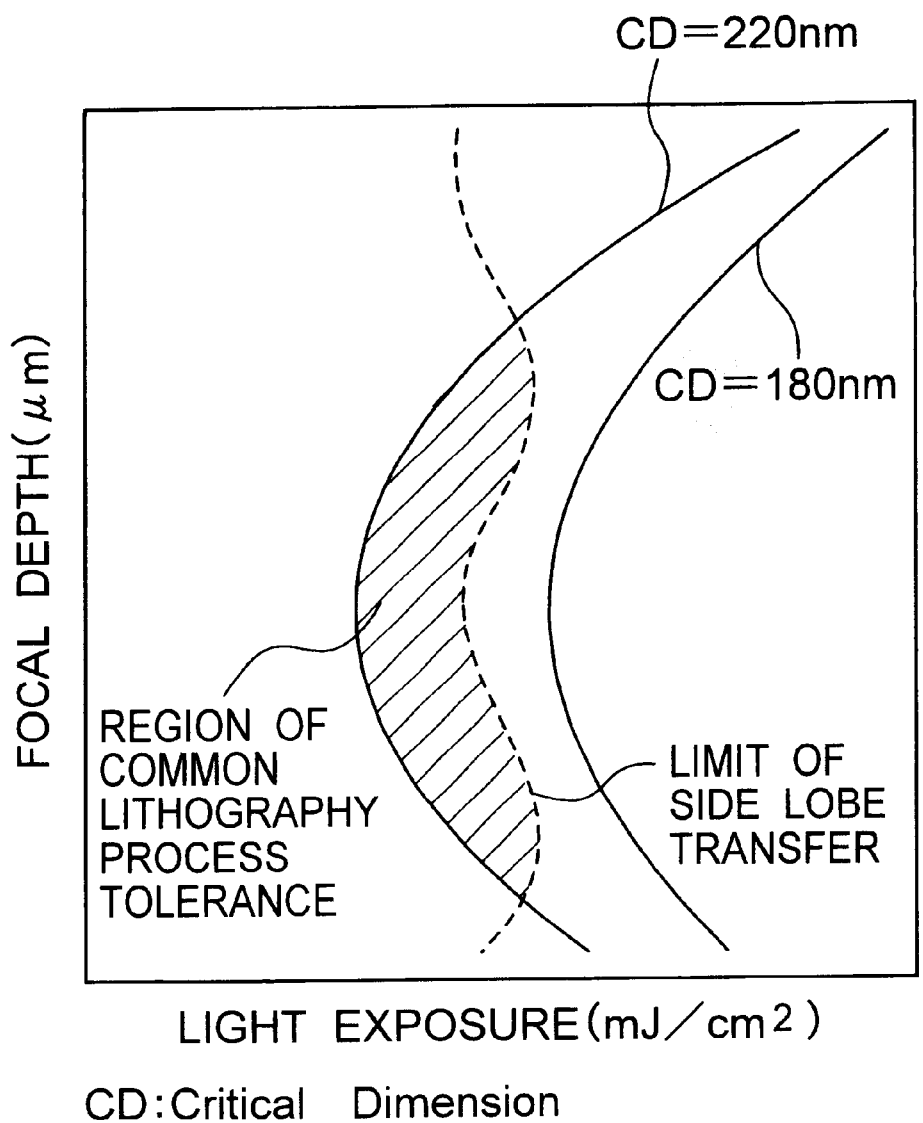
FIG. 3 is a characteristic diagram for explaining a common lithography process tolerance.

In parallel to the above described procedure at step S5a, a second lithography process tolerance indicative of the limit capable of avoiding the formation of a side lobe on the semiconductor substrate is calculated (step S5b). In FIG. 3, a dotted line shows the limit of the lithography process tolerance calculated by this procedure, and a region having a more light exposure than the dotted line is a region satisfying the second lithography process tolerance.

Then, a common lithography process tolerance is calculated on the basis of the first lithography process tolerance calculated at the above described step S5a and the second lithography process tolerance calculated at step S5b. Specifically, an overlapping region of the first and second lithography process tolerances is assumed to be the common lithography process tolerance. In the example shown in FIG. 3, the region shown by slant lines is the region of the common lithography process tolerance.

Figure 4:
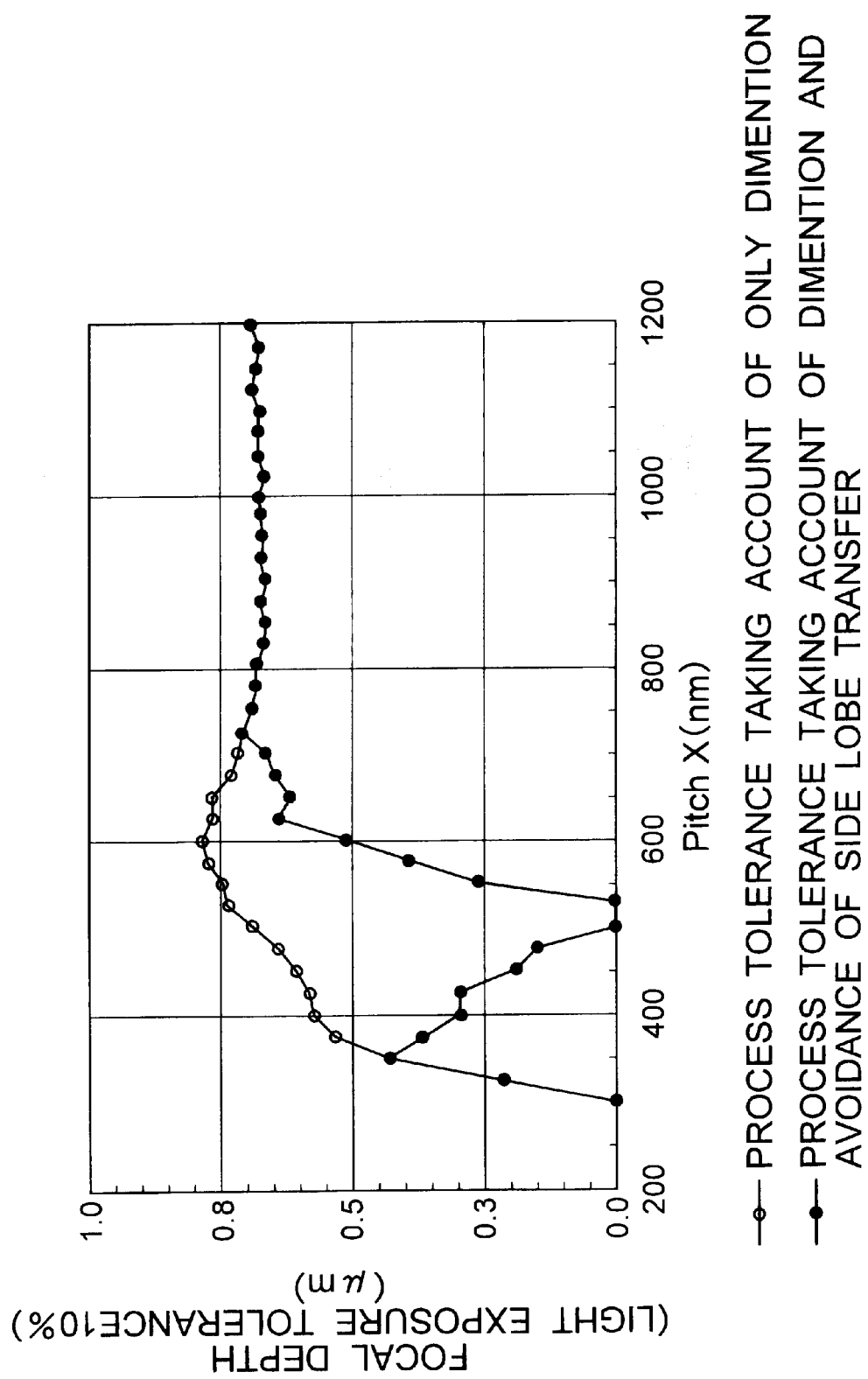
FIG. 4 is a correlation diagram showing an example of a common lithography process tolerance calculated by the designing method shown in FIG. 1.

FIG. 4 shows an example wherein common lithography process tolerances are plotted as focal depths when a light exposure tolerance of 10% is given. As shown in this figure, as compared with the conventional process tolerance taking account of only dimension, in the common lithography process tolerance in this preferred embodiment which also takes account of the avoidance of the side lobe transfer, it is revealed that the focal depth deteriorates in the range of from about 350 nm to about 725 nm, particularly the focal depth is zero in the range of from about 500 nm to about 530 nm.

Then, it is determined whether the common lithography process tolerance thus calculated satisfies the reference value set at step S3 (step S7). As a result, basic patterns satisfying the reference value are extracted to be formed as a rule table (step S8). For example, in the example shown in FIG. 4, when the light exposure tolerance of 10% is given, if a focal depth of 0.5 μm or more is set as the reference value, a rule table satisfying this reference value is a pattern pitch X≧600 nm.

On the other hand, if a rule table satisfying the reference value can not be prepared, it is revealed that the basic pattern group extracted at step S1 can not be adequately formed on the semiconductor substrate, so that a different basic pattern group is extracted to repeat the above described procedure.

(2) Second Preferred Embodiment

Figure 5:
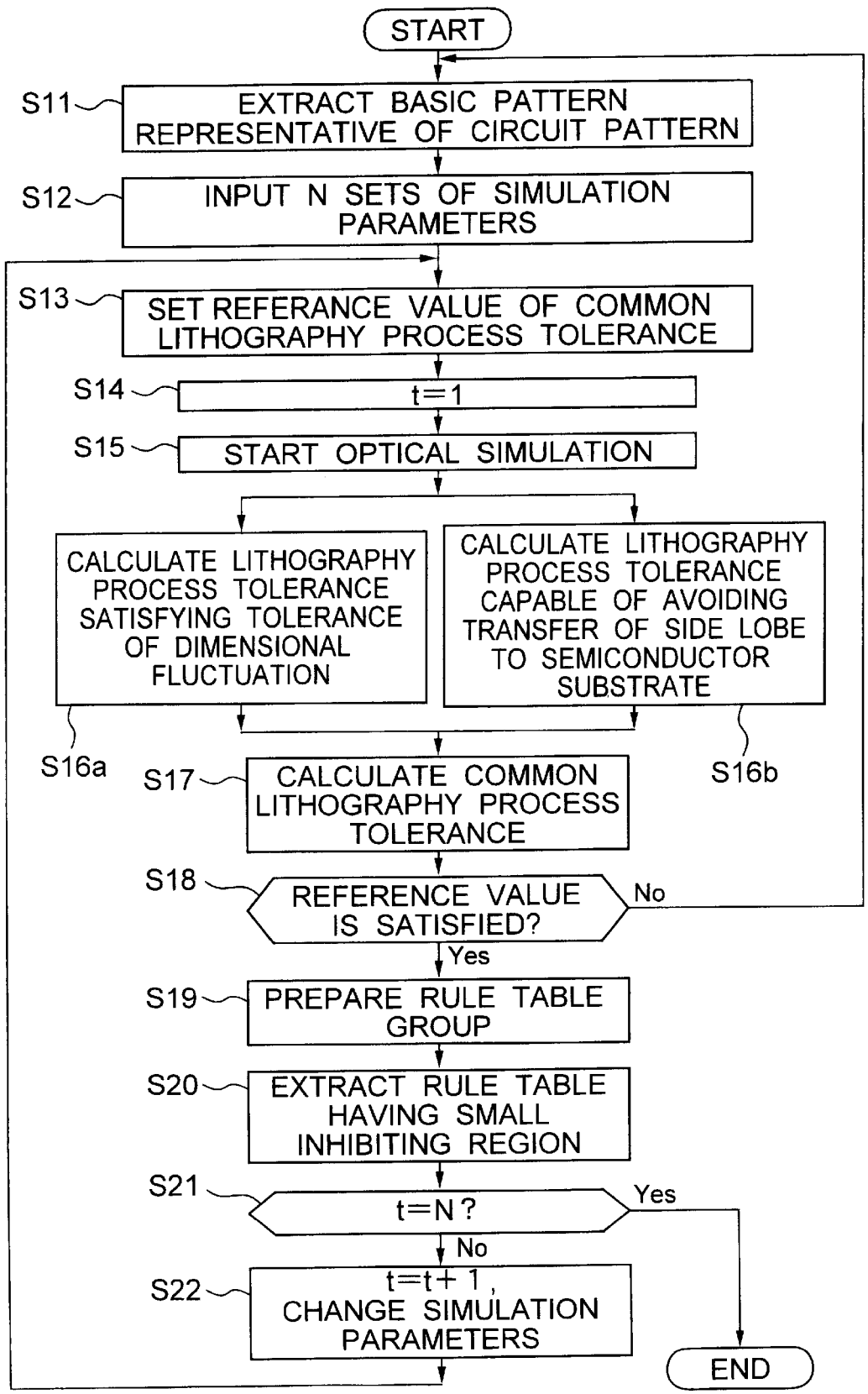
FIG. 5 is a flow chart for explaining the second preferred embodiment of a method for designing a semiconductor circuit device according to the present invention.

FIG. 5 is a flow chart for explaining the second preferred embodiment of a method for designing a semiconductor circuit device according to the present invention.

This preferred embodiment is characterized in that procedures at steps S20 through S22 are newly added to the procedures at steps S13 through S18 corresponding to steps of preparing a rule table on the basis of a set of simulation parameters inputted in the above described first preferred embodiment. The newly added procedures will be mainly described below.

First, in the procedure for inputting simulation parameters, N (N is a natural number of 2 or more) sets of simulation parameters are inputted (step S12).

Then, on the basis of a set of simulation parameters (t=1, step S14), a rule table is prepared (steps S15 through S19).

Then, until the number of simulations reaches N (step S21), the basic patterns extracted at step S11 are used as they are without being changed, and simulation parameters different from the last inputted simulation parameters are used (step S22) to prepare a different rule table (steps S15 through S19).

Then, the newly obtained rule table is compared with the rule table obtained by the last simulation, and a rule table having smaller inhibiting region is selected to be extracted (step S20).

By repeating the above described procedures N times (step S21), it is possible to extract a rule table having the smallest inhibiting region, i.e., a rule table having the smallest load in design.

Figure 6:
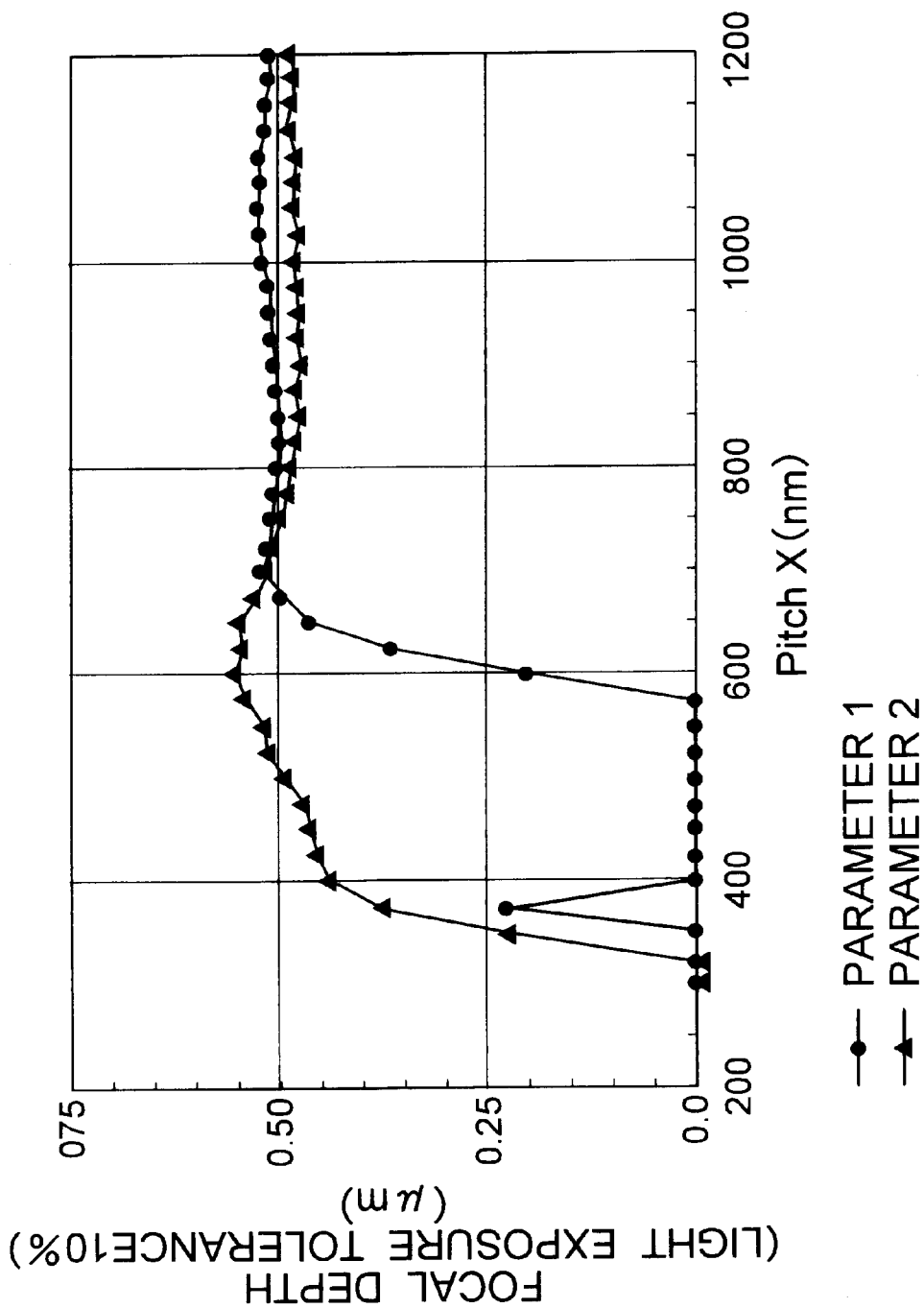
FIG. 6 is a correlation diagram showing an example of a plurality of common lithography process tolerances calculated with a plurality of simulation parameters.

FIG. 6 shows an example of a plurality of common lithography process tolerances calculated on the basis of a plurality of sets of simulation parameter conditions. This figure shows two common lithography process tolerances obtained by the above described simulation using two simulation parameters 1 and 2.

If a light exposure tolerance of 10% and a focal depth of 0.5 μm or higher are used as the reference values, a region having a pattern pitch of less than about 675 nm in X directions is an inhibiting region in a rule table calculated on the basis of the parameter 1, and a region having a pattern pitch of less than about 500 nm in X directions is an inhibiting region in a rule table calculated on the basis of the parameter 2, so that the rule table calculated on the basis of the parameter 2 is extracted.

While the current rule table has been compared with the last calculated rule table in the preferred embodiment shown in FIG. 5, the simulation results obtained by carrying out the procedures N times may be stored in a memory of a simulator, and the optimum rule table may be extracted from a rule table group stored in the memory, after all of simulations are finished. Referring to the flow chart of FIG. 7, a modified example of the above described second preferred embodiment will be described below. In this modified example, the order at steps S19 through S22 in the flow chart of FIG. 5 is modified. At this point, this modified example is different from the second preferred embodiment. This different point will be mainly described below.

First, after some basic patterns representative of a circuit pattern are extracted (step S31), N (N is a natural number of 2 or more) sets of simulator parameters are inputted (step S32), and a reference value of a lithography process tolerance is set (step S33). Then, on the basis of a set of simulator parameters (t=1, step S14), an optical simulation is started to prepared a rule table (steps S34 through S39).

The above described procedures (steps S35 through S39) from the starting of the optical simulation to the preparation of the rule table are repeated while the simulation parameters are changed (step S41) until the number of simulations reaches N (step S40). Thus, a rule table group of N different rule tables is prepared (steps S39 through S41).

Then, from the rule table group thus obtained, a rule table having the smallest inhibiting region is selected and extracted (step S42).

Also in this modified example, it is possible to extract a rule table having the smallest inhibiting region, i.e., a rule table having the smallest load in design.

(3) Third Preferred Embodiment

Referring to the accompanying drawings, the third preferred embodiment of a method for designing a semiconductor device according to the present invention will be described below.

This preferred embodiment is characterized in that a side lobe correction factor, which is one of simulator parameters, is set on the basis of an experimental value. Other points are the same as those in the above described first and second preferred embodiments. Therefore, referring to the flow chart of FIG. 8, a method for setting a side lobe correction factor will be mainly described below.

Figure 8:
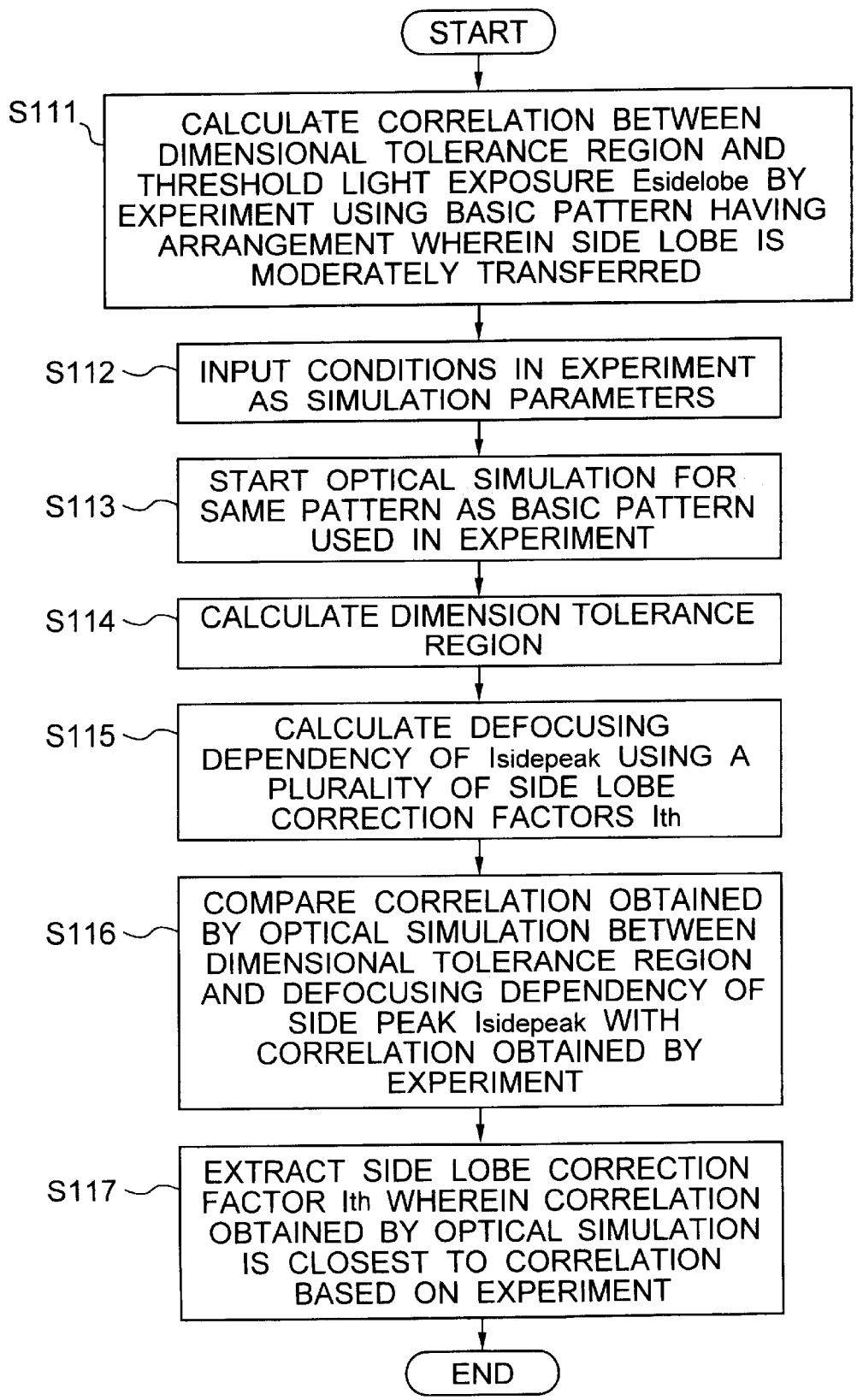
FIG. 8 is a flow chart for explaining a process for calculating a side lobe correction factor based on an experiment in the third preferred embodiment of a method for designing a semiconductor device according to the present invention.

As shown in FIG. 8, using a basic pattern having an arrangement wherein a side lobe is moderately transferred, the defocusing dependencies of a region (which will be hereinafter referred to as a "dimension tolerance region") satisfying a tolerance of a dimensional fluctuation, and of a threshold value (which will be hereinafter referred to as a "side lobe threshold light exposure $E_{sidelobe}$") of a light exposure, at which the side lobe is transferred, are calculated by an experiment (step S111) to be plotted on a plane using light exposure and defocusing as axes.

Figure 9A:
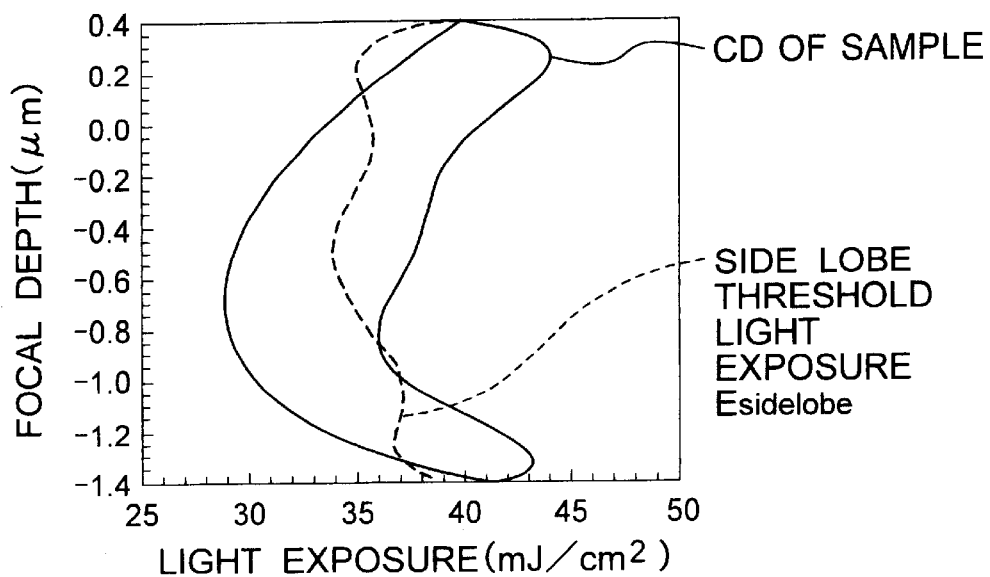
FIGS. 9A and 9B are correlation diagrams for explaining the third preferred embodiment of a method for designing a semiconductor device according to the present invention.

FIG. 9A shows an example of a correlation between a dimensional tolerance region and a threshold light exposure which are acquired at step 111. In this figure, a substantially half-moon-shaped region surrounded by a solid line (a limit dimension value of a sample) is a tolerance of a dimensional fluctuation, and a dotted line plotted so as to vertically pass through the substantially center of the substantially half-moon-shaped region denotes a side lobe threshold light exposure $E_{sidelobe}$.

Then, the conditions in the experiment are used as simulation parameters (step S112), and an optical simulation is carried out using the same pattern as the basic pattern used in the experiment (step S113). Then, a region satisfying the dimensional tolerance is calculated similar to the experiment (step S114) to be similarly plotted on a plane using light exposure E and defocusing as axes.

Then, with respect to some correction factors $I_{th}$ (which will be hereinafter referred to as "side lobe correction factors $I_{th}$") for correcting a transfer characteristic of a side lobe which varies in accordance with a resist process, the defocusing dependency of a peak light intensity (which will be hereinafter referred to as a "side peak $I_{sidepeak}$") of a side lobe portion calculated from the optical simulation is plotted on a light exposure-defocusing plane using the following relational expression (step S115).

$$\text{Log } E_{sidelobe} = \log (I_{th}/I_{sidepeak})$$

Figure 9B:
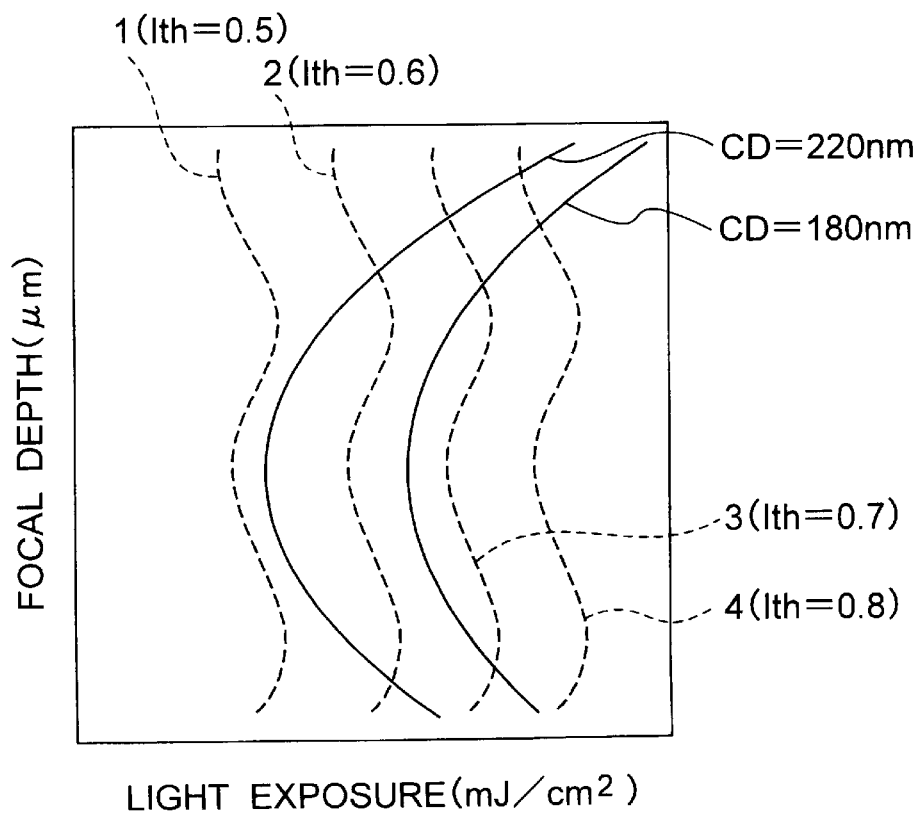

FIG. 9B shows an example of defocusing dependencies of a dimension tolerance region and a side peak $I_{sidepeak}$ which have been acquired by the above described optical simulation. In this figure, a region surrounded by a solid line is a dimensional tolerance region, and broken lines 1 through 4 show the defocusing dependencies of a side peak $I_{sidepeak}$ when the side lobe correction factor $I_{th}$ is 0.5, 0.6, 0.7 and 0.8, respectively.

Then, the correlation obtained by the experiment between the dimensional tolerance region and the defocusing dependency of the side peak $I_{sidepeak}$ is compared with the correlation obtained by the optical simulation between the dimensional tolerance region and the defocusing dependency of the side peak $I_{sidepeak}$ (step S116), and a side lobe correction factor $I_{th}$ wherein the correlation obtained by the optical simulation is closest to the correlation based on the experiment is extracted (step S117). Specifically, this is extracted by comparing the correlation in the light exposure-defocusing plane. As described above, in the experimental results shown in FIG. 7(a), the side lobe threshold is arranged substantially at the center of the dimensional tolerance region. Therefore, in the optical simulation results shown in FIG. 7(b), the relative position at $I_{th}$=0.6 is substantially coincident with the experimental result. By this result, the side lobe correction factor $I_{th}$ indicative of the resist process used for the experiment can be derived to be 0.6.

Figure 7:
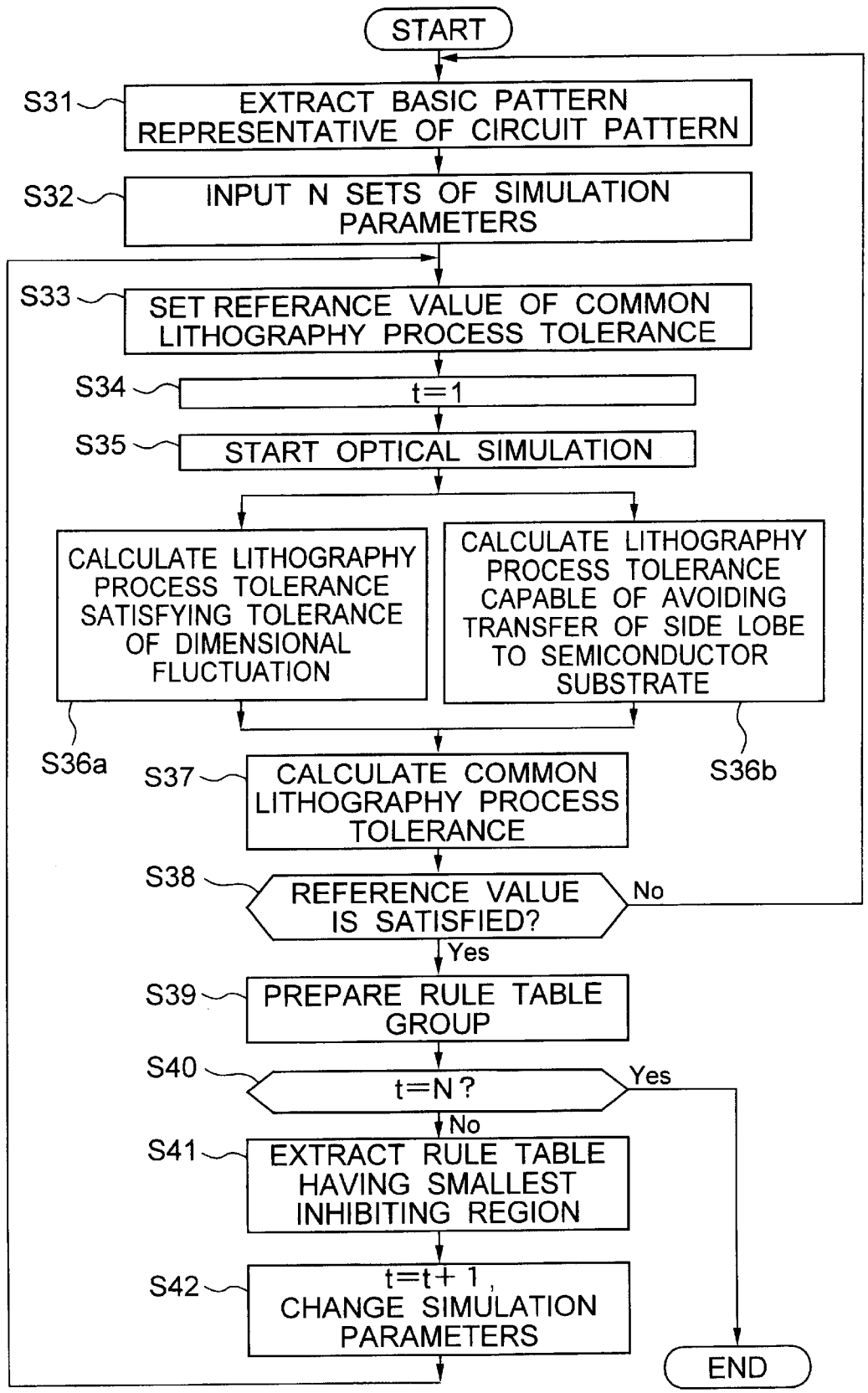
FIG. 7 is a flow chart for explaining a modified example of the preferred embodiment shown in FIG. 5.

Thereafter, this side lobe correction factor $I_{th}$, i.e., 0.6 in the example shown in FIG. 7, is used as a simulation parameter to extract a rule table having a small inhibiting region by means of an optical simulation by the circuit designing method shown in FIG. 5, 7 or 8.

Thus, according to the circuit designing method for the semiconductor device in this preferred embodiment, a side lobe correction factor indicative of a resist process for forming a circuit serving as an object to be designed is previously calculated on the basis of the previous experiment, so that the precision of the optical simulation can be enhanced.

A series of procedures for the above described three preferred embodiments of a circuit designing method for a semiconductor device according to the present invention may be stored in a computer-readable medium, such as a floppy disk or a CD-ROM, as a program read and executed by a computer. Thus, a circuit designing method for a semiconductor device according to the present invention can be realized by means of a general purpose computer, such as a work station. The computer-readable medium should not be limited to a portable medium, such as a magnetic disk or an optical disk, but it may be a fixed recording medium, such as a hard disk unit or a memory. In addition, a program including a series of procedures for the above described circuit designing method may be distributed via communication lines (including radio communication lines), such as internet. Moreover, a program including a series of procedures for the above described circuit designing method may be enciphered, modulated or compressed to be distributed via wire or radio communication lines, such as internet, or to be stored in a recording medium to be distributed.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A circuit designing method for a semiconductor device, which uses a half-tone phase shift mask for forming a circuit pattern on a semiconductor substrate, said method comprising:
   a first step of extracting a basic pattern representative of said circuit pattern from design information;
   a second step of setting parameters serving as conditions for a circuit design;
   a third step of calculating a first lithography process tolerance, which is an index satisfying a range of a dimensional fluctuation allowed when said basic pattern is formed on said semiconductor substrate, using an optical simulation;
   a fourth step of calculating a second lithography process tolerance, which is an index capable of avoiding the formation of a side lobe capable of being produced on said semiconductor substrate when said basic pattern is formed on said semiconductor substrate using said half-tone phase shift mask, using an optical simulation;
   a fifth step of calculating a common lithography process tolerance comprising an overlapping region of said first lithography process tolerance and said second lithography process tolerance;
   a sixth step of preparing an inhibiting rule for excluding a circuit pattern including said basic pattern, which is below a reference value previously set on the basis of said common lithography process tolerance, from an object to be designed; and
   a seventh step of designing a circuit using said inhibiting rule.

2. A circuit designing method for a semiconductor device as set forth in claim 1, wherein said second step is a step of setting a plurality of combinations of said parameters, and said fifth step is a step of switching said combinations to repeat said third and fourth steps to prepare said inhibiting rule so that the number of circuit patterns excluded from said object to be designed is minimum.

3. A circuit designing method for a semiconductor device as set forth in claim 1, wherein said parameters include a side lobe transfer threshold for determining the presence of the transfer of said side lobe, and said fourth step includes a step of correcting said side lobe transfer threshold so that a correlation between said first lithography process tolerance and said second lithography process tolerance is closest to an experimental value with respect to said basic pattern.

4. A circuit designing method for a semiconductor device as set forth in claim 1, wherein said first lithography process tolerance, said second lithography process tolerance, and said common lithography process tolerance include a tolerance of a focal depth or a tolerance of a light exposure.

5. A circuit designing method for a semiconductor device as set forth in claim 1, wherein said first lithography process tolerance, said second lithography process tolerance, and said common lithography process tolerance include a positive resist process, and said circuit pattern includes a contact hole pattern.

6. A circuit designing method for a semiconductor device as set forth in claim 1, wherein said first lithography process tolerance, said second lithography process tolerance, and said common lithography process tolerance include a positive resist process, and said circuit pattern includes an isolated space pattern.

7. A circuit designing method for a semiconductor device as set forth in claim 1, wherein said first lithography process tolerance, said second lithography process tolerance, and said common lithography process tolerance include a negative resist process, and said circuit pattern includes a pillar dot pattern.

8. A circuit designing method for a semiconductor device as set forth in claim 1, wherein said first lithography process tolerance, said second lithographic process tolerance, and said common lithographic process tolerance include a negative resist process, and said circuit pattern includes an isolated line pattern.

9. A computer-readable medium for use in a circuit designing system for designing a semiconductor device using a half-tone phase shift mask for forming a circuit pattern on a semiconductor substrate, said computer-readable medium having recorded a program for causing a computer to execute a circuit designing method for said semiconductor device, said method including:

a first procedure for extracting a basic pattern representative of said circuit pattern from design information;

a second procedure for setting parameters serving as conditions for a circuit design;

a third procedure for calculating a first lithography process tolerance, which is an index satisfying a range of a dimensional fluctuation allowed when said basic pattern is formed on said semiconductor substrate, using an optical simulation;

a fourth procedure for calculating a second lithography process tolerance, which is an index capable of avoiding the formation of a side lobe capable of being produced on said semiconductor substrate when said basic pattern is formed on said semiconductor substrate using said half-tone phase shift mask, using an optical simulation;

a fifth procedure for calculating a common lithography process tolerance comprising an overlapping region of said first lithography process tolerance and said second lithography process tolerance;

a sixth procedure for preparing an inhibiting rule for excluding a circuit pattern including said basic pattern, which is below a reference value previously set on the basis of said common lithography process tolerance, from an object to be designed; and a seventh procedure for designing a circuit using said inhibiting rule.

10. The computer-readable medium as set forth in claim 9, wherein said second procedure is a procedure for setting a plurality of combinations of said parameters, and said fifth procedure is a procedure for switching said combinations to repeat said third and fourth steps to prepare said inhibiting rule so that the number of circuit patterns excluded from said object to be designed is minimum.

11. The computer-readable medium as set forth in claim 9, wherein said parameters include a side lobe transfer threshold for determining the presence of the transfer of said side lobe, and said fourth procedure includes a procedure for correcting a side lobe transfer threshold so that a correlation between said first lithography process tolerance and said second lithography process tolerance is closest to an experimental value with respect to said basic pattern.

12. The computer-readable medium as set forth in claim 9, wherein said first lithography process tolerance, said second lithography process tolerance, and said common lithography process tolerance include a tolerance of a focal depth or a tolerance of a light exposure.

13. The computer-readable medium as set forth in claim 9, wherein said first lithography process tolerance, said second lithography process tolerance, and said common lithography process tolerance include a positive resist process, and said circuit pattern includes a contact hole pattern.

14. The computer-readable medium as set forth in claim 9, wherein said first lithography process tolerance, said second lithography process tolerance, and said common lithography process tolerance include a positive resist process, and said circuit pattern includes an isolated space pattern.

15. The computer-readable medium as set forth in claim 9, wherein said first lithography process tolerance, said second lithography process tolerance, and said common lithography process tolerance include a negative resist process, and said circuit pattern includes a pillar dot pattern.

16. The computer-readable medium as set forth in claim 9, wherein said first lithography process tolerance, said second lithography process tolerance, and said common lithography process tolerance include a negative resist process, and said circuit pattern includes an isolated line pattern.

* * * * *